US008541820B2

(12) United States Patent
Hayasaki et al.

(10) Patent No.: US 8,541,820 B2
(45) Date of Patent: Sep. 24, 2013

(54) SEMICONDUCTOR DEVICE INCLUDING THROUGH-ELECTRODE

(75) Inventors: Yuko Hayasaki, Kamakura (JP); Kenichiro Hagiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 476 days.

(21) Appl. No.: 12/822,735

(22) Filed: Jun. 24, 2010

(65) Prior Publication Data

US 2010/0327383 A1 Dec. 30, 2010

(30) Foreign Application Priority Data

Jun. 29, 2009 (JP) ................................. 2009-154009

(51) Int. Cl.
*H01L 27/14* (2006.01)
*H01L 27/146* (2006.01)

(52) U.S. Cl.
USPC ............ 257/225; 257/81; 257/184; 257/222; 257/432; 257/E27.13; 257/E23.174; 438/57; 438/667

(58) Field of Classification Search
USPC ............ 257/53, 81, 184, 186, 187, 222, 225, 257/233–234, 276, 414, 432, 433–436, 440, 257/444, 698, E27.122, E27.13, E27.133–E27.138, 257/E27.141–E27.144, E27.174; 438/7, 438/16, 48, 57, 116, 667
See application file for complete search history.

(56) References Cited

U.S. PATENT DOCUMENTS

| | | | |
|---|---|---|---|
| 6,699,787 B2* | 3/2004 | Mashino et al. | 438/667 |
| 7,045,870 B2* | 5/2006 | Wataya | 257/433 |
| 7,227,236 B1* | 6/2007 | Lee et al. | 257/433 |
| 7,342,302 B2* | 3/2008 | Kanaoka et al. | 257/700 |
| 7,564,079 B2* | 7/2009 | Mabuchi et al. | 257/229 |
| 7,638,823 B2* | 12/2009 | Maeda et al. | 257/225 |
| 7,808,064 B2* | 10/2010 | Kawasaki et al. | 257/432 |
| 7,851,880 B2* | 12/2010 | Suzuki et al. | 257/448 |
| 7,859,033 B2* | 12/2010 | Brady | 257/294 |
| 7,964,926 B2* | 6/2011 | Kim | 257/431 |
| 8,049,256 B2* | 11/2011 | Guidash | 257/292 |

(Continued)

FOREIGN PATENT DOCUMENTS

| | | |
|---|---|---|
| JP | 2006-32699 | 2/2006 |
| JP | 2007-36060 | 2/2007 |
| JP | 2007-88163 | 4/2007 |

OTHER PUBLICATIONS

Office Action issued Jan. 31, 2013 in Taiwanese Patent Application No. 099119134 (with English translation).

*Primary Examiner* — Laura Menz
*Assistant Examiner* — Maliheh Malek
(74) *Attorney, Agent, or Firm* — Oblon, Spivak, McClelland, Maier & Neustadt, L.L.P.

(57) ABSTRACT

According to one embodiment, a semiconductor device includes the following structure. The first insulating film is formed on a first major surface of a semiconductor substrate. The electrode pad is formed in the first insulating film. The electrode pad includes a conductive film. At least a part of the conductive film includes a free region in which the conductive film is not present. The external connection terminal is formed on a second major surface facing the first major surface. The through-electrode is formed in a through-hole formed from the second major surface side of the semiconductor substrate and reaching the electrode pad. The first insulating film is present in the free region, and a step, on a through-electrode side, between the first insulating film being present in the free region and the electrode pad is not greater than a thickness of the electrode pad.

7 Claims, 17 Drawing Sheets

(56) References Cited

U.S. PATENT DOCUMENTS

| | | | |
|---|---|---|---|
| 2005/0030403 A1* | 2/2005 | Yaung et al. | 348/308 |
| 2006/0145347 A1* | 7/2006 | Aida | 257/758 |
| 2008/0012086 A1* | 1/2008 | Misawa | 257/435 |
| 2008/0083939 A1* | 4/2008 | Guidash | 257/292 |
| 2008/0237766 A1* | 10/2008 | Kim | 257/432 |
| 2008/0265138 A1* | 10/2008 | Uya | 250/208.1 |
| 2008/0265296 A1* | 10/2008 | Uya | 257/292 |
| 2009/0050996 A1* | 2/2009 | Liu et al. | 257/434 |
| 2009/0159944 A1* | 6/2009 | Oh | 257/292 |
| 2009/0218696 A1* | 9/2009 | Jung et al. | 257/762 |
| 2009/0284631 A1* | 11/2009 | Matsuo et al. | 348/294 |
| 2010/0006963 A1* | 1/2010 | Brady | 257/432 |
| 2010/0141816 A1* | 6/2010 | Maruyama et al. | 348/294 |
| 2010/0190338 A1* | 7/2010 | Koike et al. | 438/667 |
| 2010/0207224 A1* | 8/2010 | Saito et al. | 257/432 |
| 2010/0264503 A1* | 10/2010 | Inoue et al. | 257/432 |
| 2012/0242876 A1* | 9/2012 | Hagiwara | 348/294 |
| 2012/0267690 A1* | 10/2012 | Endo et al. | 257/225 |

* cited by examiner

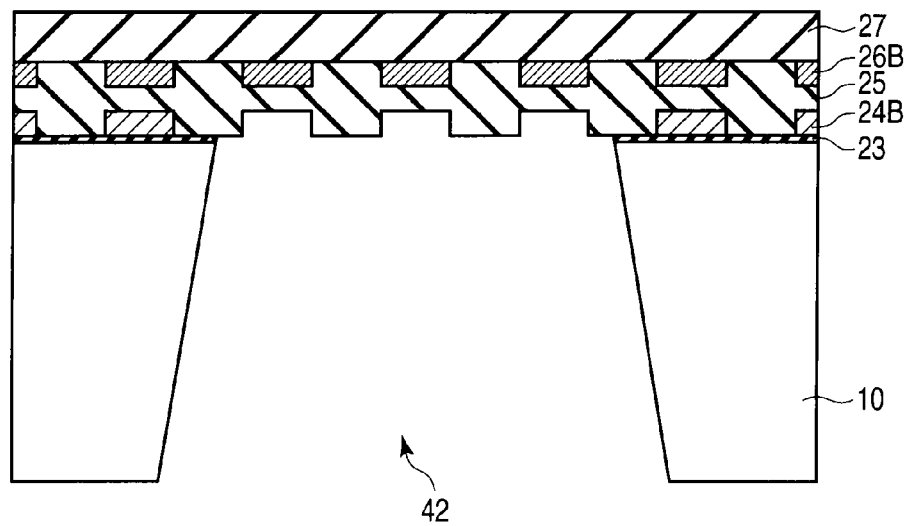
F I G. 7
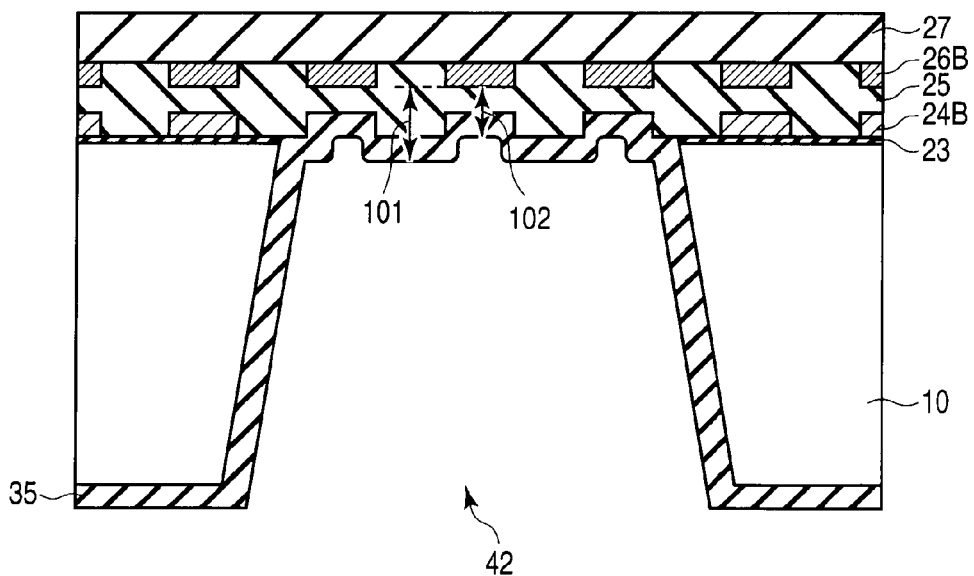
F I G. 8

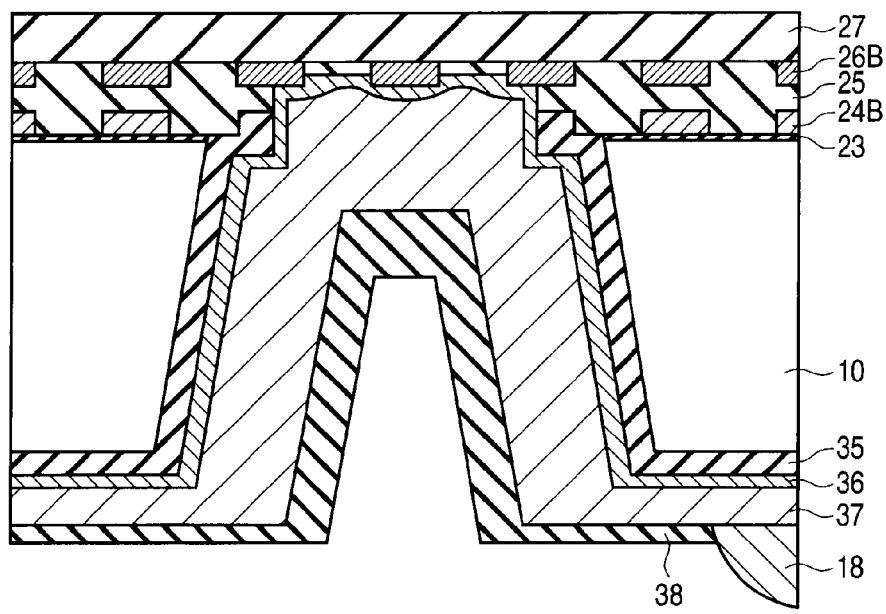
F I G. 11
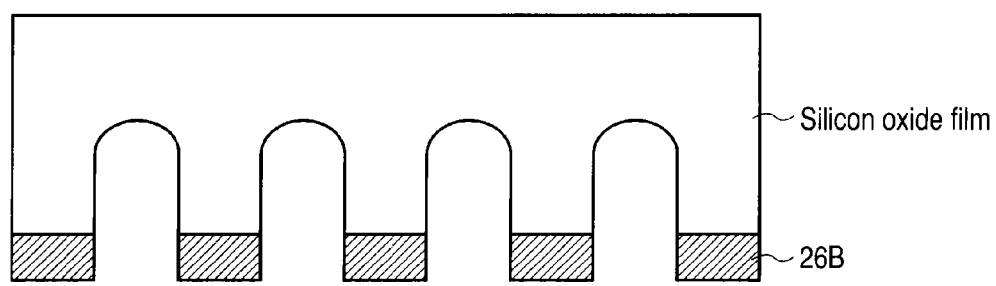
F I G. 12

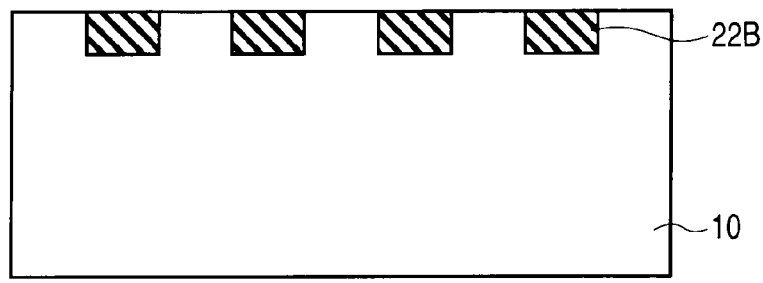
F I G. 14
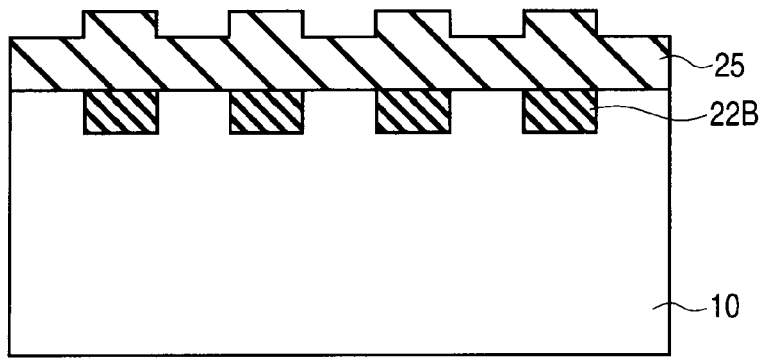
F I G. 15
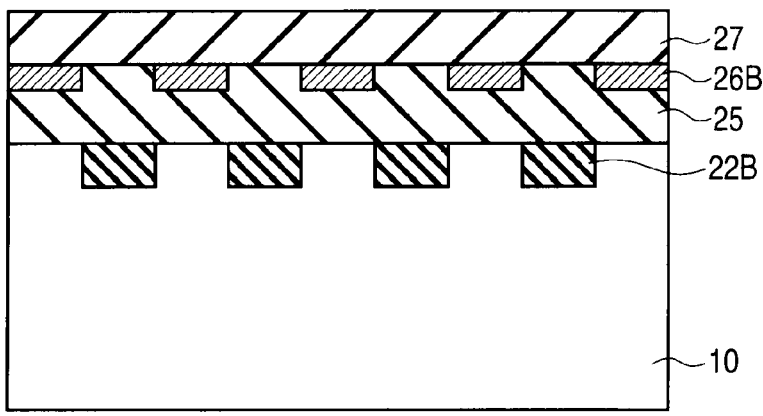
F I G. 16

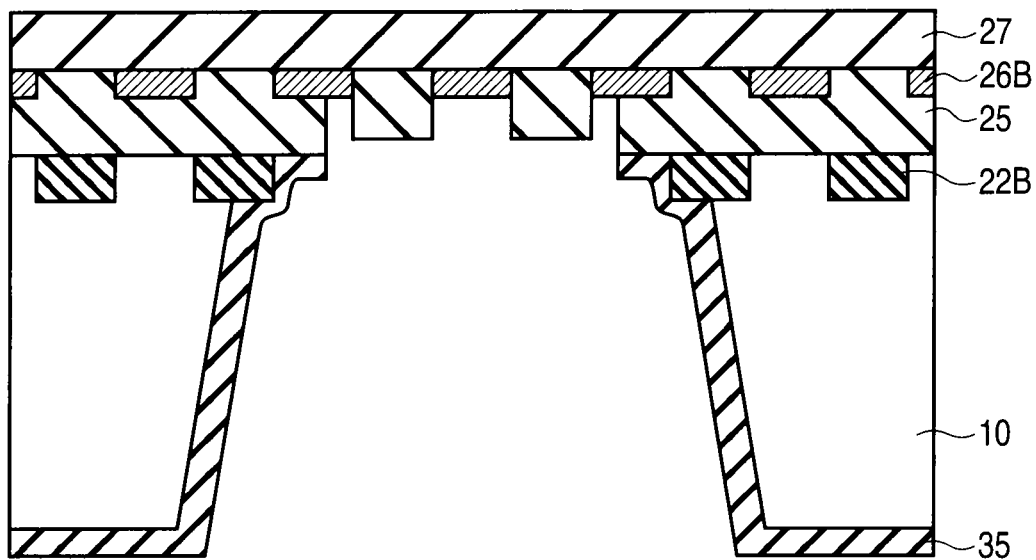
F I G. 19
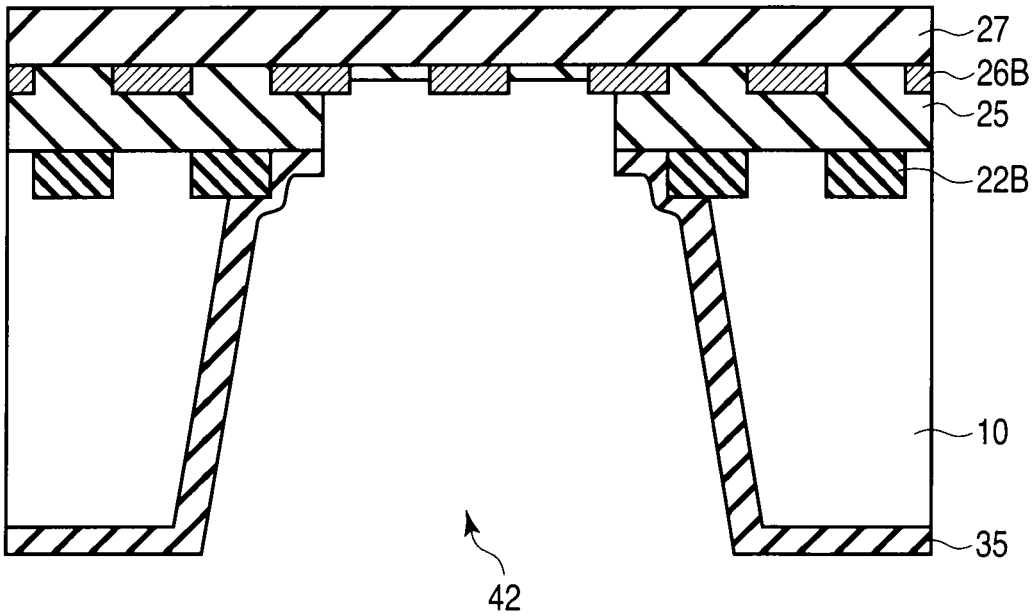
F I G. 20

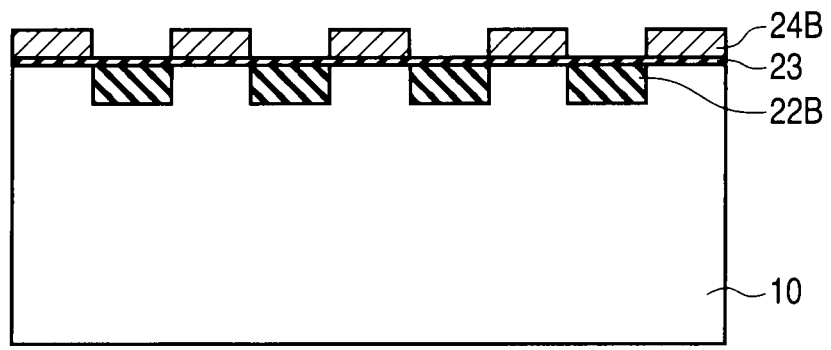
F I G. 23
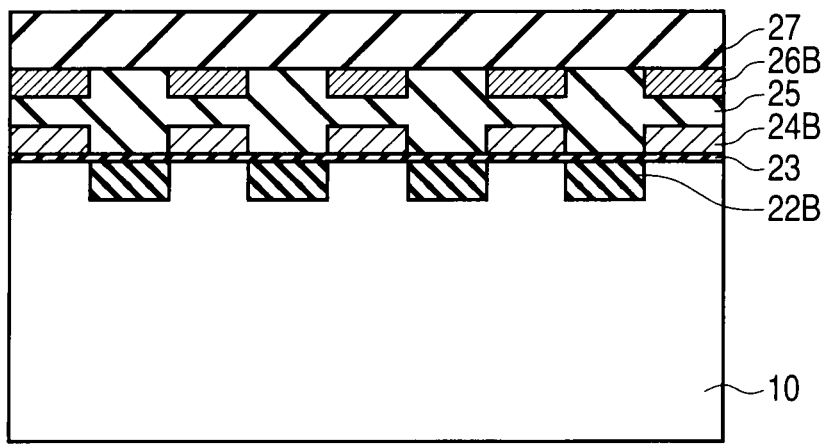
F I G. 24

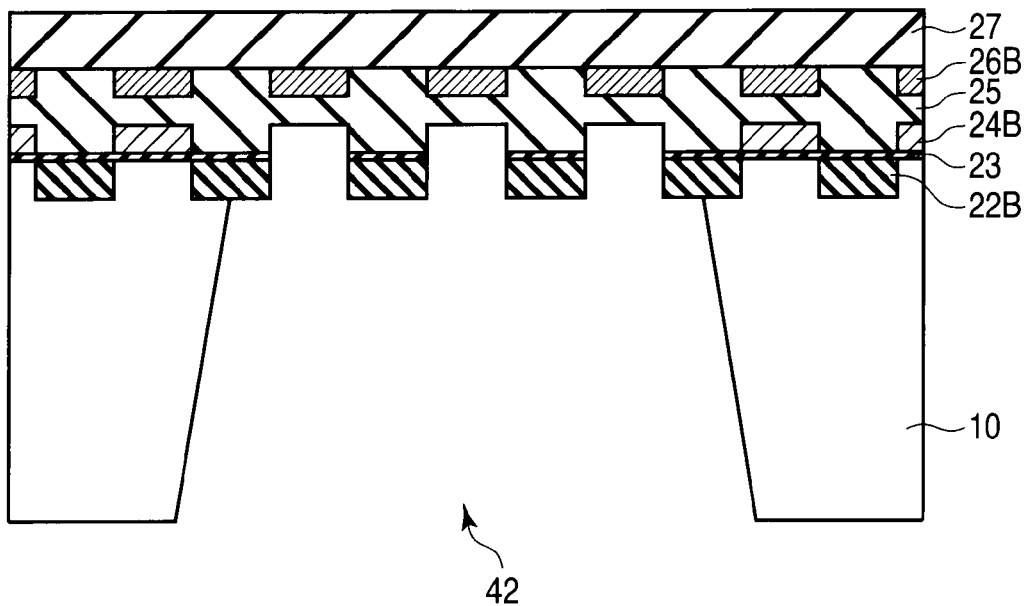
F I G. 25
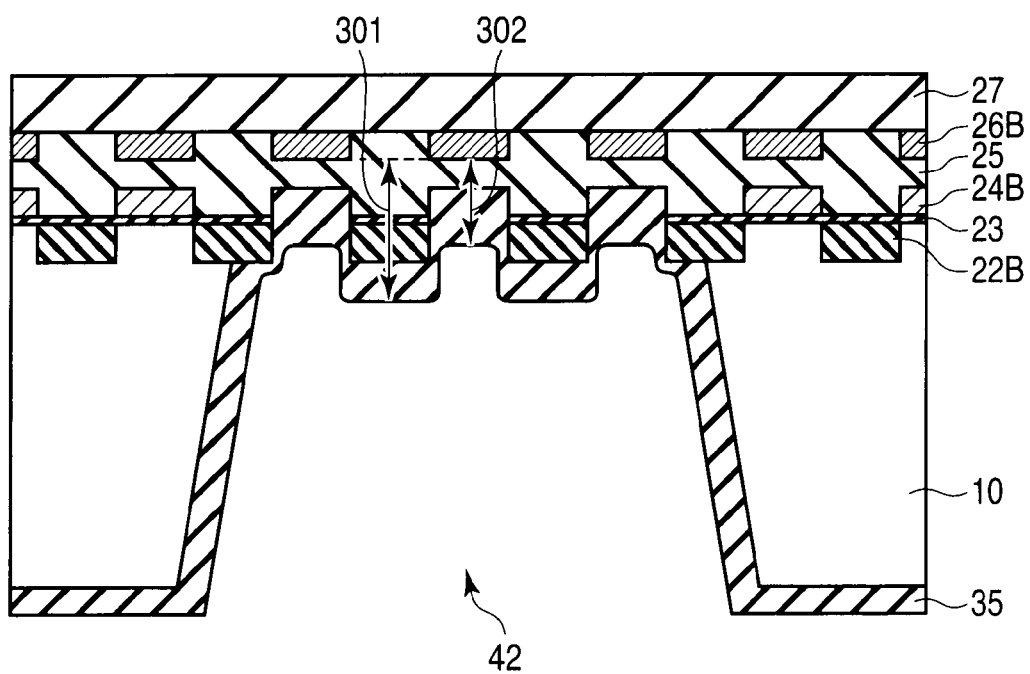
F I G. 26

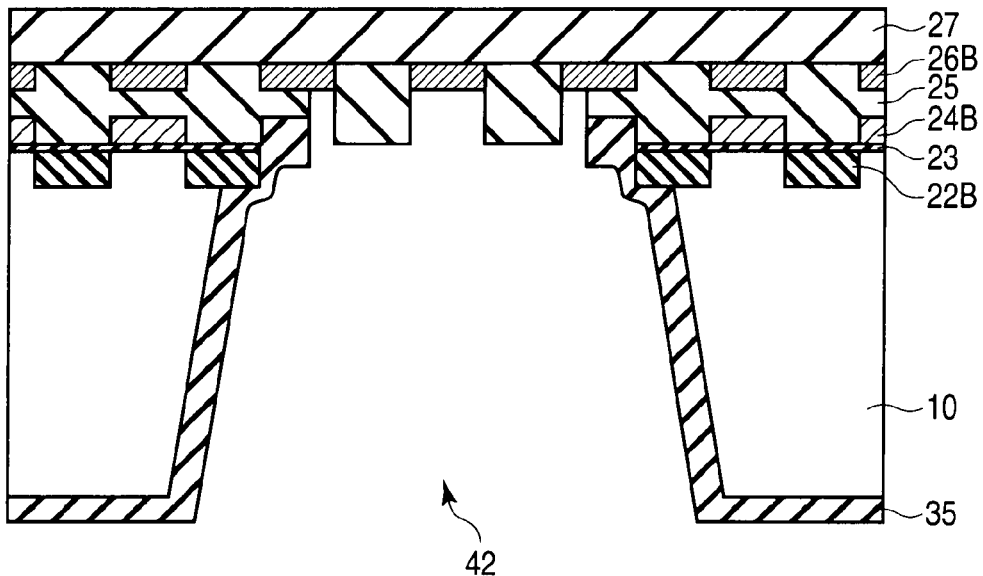
F I G. 27
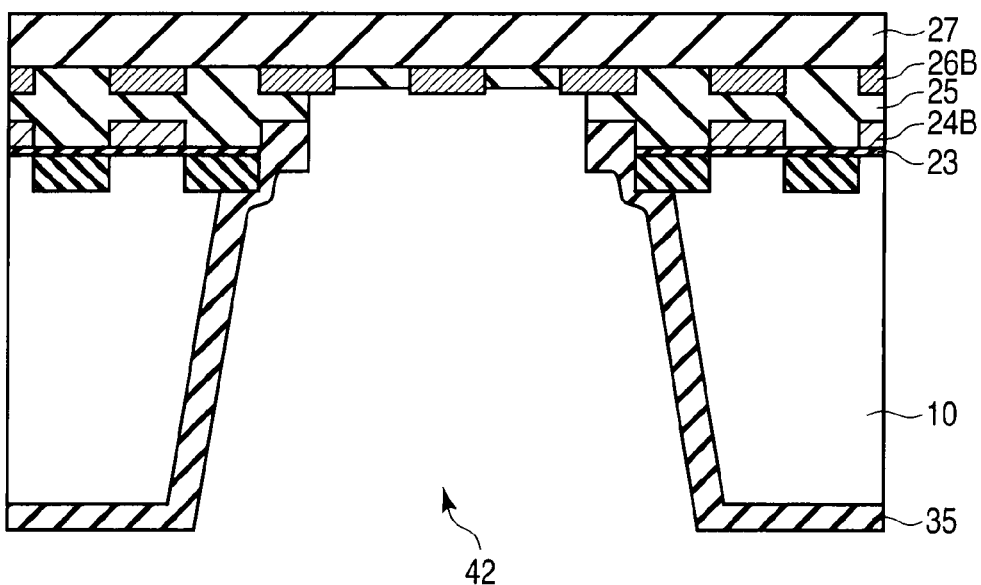
F I G. 28

SEMICONDUCTOR DEVICE INCLUDING THROUGH-ELECTRODE

CROSS-REFERENCE TO RELATED APPLICATIONS

This application is based upon and claims the benefit of priority from Japanese Patent Application No. 2009-154009, filed Jun. 29, 2009; the entire contents of which are incorporated herein by reference.

FIELD

Embodiments described herein relate generally to a semiconductor device and a method of manufacturing the same, for example, a solid-state imaging device using a through-electrode.

BACKGROUND

In recent years, with the advance of miniaturization of a cellular phone, a demand for miniaturization of a camera module to be mounted on the cellular phone has been increasing. In order to satisfy the demand, application of a through-electrode technique and an increase in integration density of a sensor chip have been planned.

For example, when rewiring is performed on a rear surface side of an imaging semiconductor element by using a through-electrode to form a solder ball terminal, a camera module smaller than that obtained by using conventional wire bonding can be formed (for example, see Jpn. Pat. Appln. KOKAI Publication No. 2006-32699).

In this case, an electrode pad portion to which the through-electrode is connected is desired to be flat. When a semiconductor substrate on which an imaging element is formed is viewed from a first major surface side of the semiconductor substrate, the electrode pad to which the through-electrode is connected is a rectangular or square flat film. A through-hole is formed from a second major surface side of the semiconductor substrate to the electrode pad. Thereafter, the through-electrode is formed on the electrode pad and in the through-hole.

On the other hand, with the increase in degree of integration of a sensor chip, a copper (Cu) interconnection has been used to reduce an interconnection resistance of an LSI. A vapor pressure of a copper halide is low, and dry etching of copper cannot be easily performed. For this reason, unlike in aluminum interconnection, a process in which, after a metal film is formed on an entire surface, the metal is processed into an interconnection shape by reactive ion etching (RIE) cannot be used. For this reason, a copper interconnection is assumed to be a buried interconnection, and must be processed by the chemical mechanical polishing (CMP) technique. However, as in an electrode pad, when CMP is performed to a large-size copper pattern, amounts of polishing are different from each other in the copper pattern to disadvantageously cause dishing.

Therefore, when a through-electrode is connected to an electrode pad comprising copper, the electrode pad has a pattern in which copper-free regions are arranged at predetermined intervals. In order to cause the through-electrode to penetrate to the electrode pad, a silicon substrate is etched. Thereafter, an interlayer insulating film on a rear side of the electrode pad is etched.

Etching is performed for a time longer than an arithmetically obtained time (overetching) to eliminate a difference in etching amounts over an entire region on a wafer plane and reliably form a hole to an electrode pad. Since the electrode pad has a pattern with a net-like copper-free region or rod-like copper-free regions, oxide films present in the free regions between the electrode pads are excessively etched, and a large step is formed between an electrode pad portion and an oxide film portion.

Thereafter, a barrier metal and seed copper are sputtered in the through-hole to form a through-electrode, and copper is plated by electrolytic plating. In this case, if a large step is present between the electrode pad portion and the oxide film portion, the barrier metal and the seed copper are not sufficiently formed, and a void occurs upon copper plating. In this manner, when the void occurs between the electrode pads, the through-electrode is deteriorated in reliability.

BRIEF DESCRIPTION OF THE DRAWINGS

FIGS. 4 to 11 are a sectional view showing a method of manufacturing the through-electrode in the camera module according to the first embodiment;

FIG. 12 is a sectional view of an electrode pad serving as a comparative example in formation of a through-hole;

FIGS. 14 to 21 are a sectional view showing a method of manufacturing the through-electrode in the camera module according to the second embodiment;

FIGS. 23 to 29 are a sectional view showing a method of manufacturing the through-electrode in the camera module according to the third embodiment.

DETAILED DESCRIPTION

A semiconductor device according to an embodiment and a method of manufacturing the semiconductor device will be described below with reference to the accompanying drawings. In this case, a solid-state imaging device exemplified as a semiconductor device, for example, a camera module will be described.

In general, according to one embodiment, a semiconductor device includes a first insulating film, an electrode pad, an external connection terminal and a through-electrode. The first insulating film is formed on a first major surface of a semiconductor substrate. The electrode pad is formed in the first insulating film on the first major surface. The electrode pad includes a conductive film. At least a part of the conductive film includes a free region in which the conductive film is not present. The external connection terminal is formed on a second major surface facing the first major surface of the semiconductor substrate. The through-electrode is formed in a through-hole formed from the second major surface side of the semiconductor substrate and reaching the electrode pad. The through-electrode electrically connects the electrode pad and the external connection terminal to each other. The first insulating film is present in the free region included in the electrode pad, and a step, on a through-electrode side, between the first insulating film being present in the free region and the electrode pad is not greater than a thickness of the electrode pad.

First Embodiment

A camera module according to a first embodiment will be described below.

Figure 1:
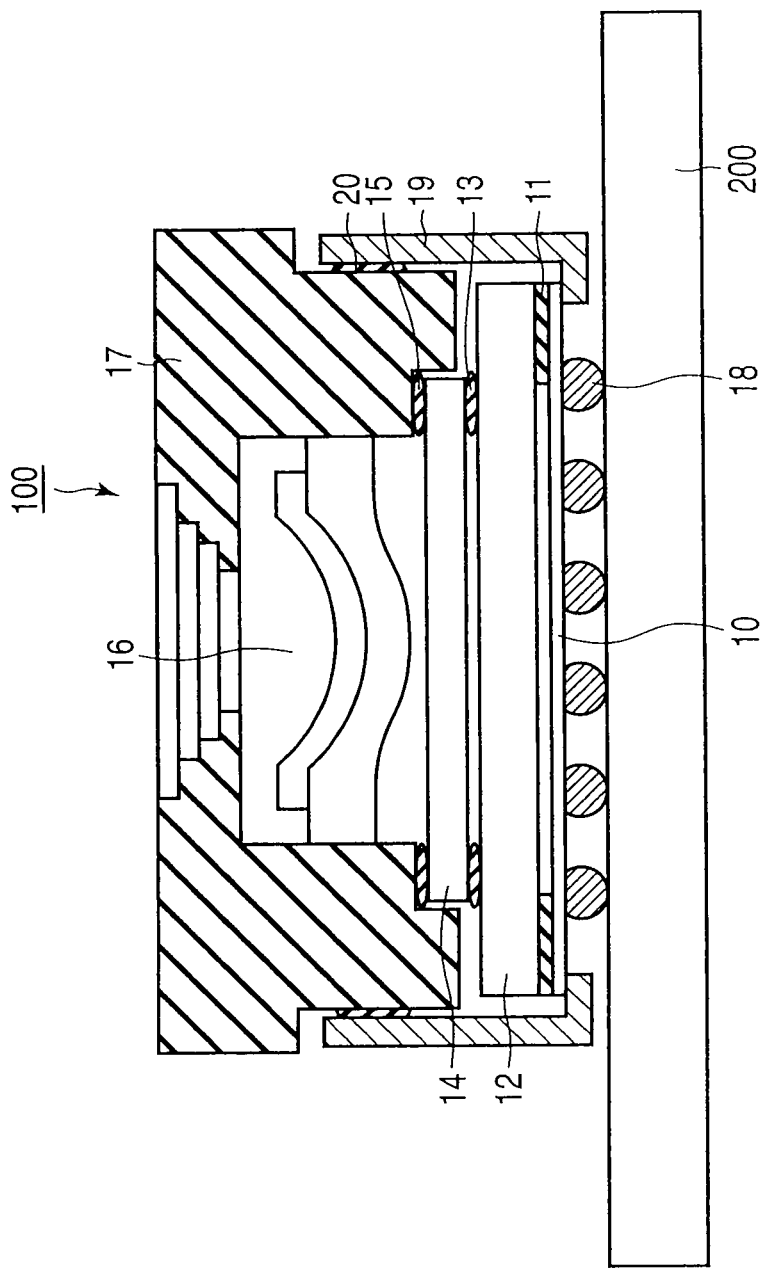
FIG. 1 is a sectional view showing a configuration of a camera module according to an embodiment.

FIG. 1 is a sectional view showing a configuration of the camera module according to the first embodiment. On a first major surface of a silicon semiconductor substrate (imaging element chip) 10 on which an imaging element (not shown) is formed, a light transmittance support substrate (transparent substrate), for example, a glass substrate 12 is formed through an adhesive agent 11. On the glass substrate 12, an infrared (IR) cut filter 14 is arranged through an adhesive agent 13. Furthermore, on the IR cut filter 14, a lens holder 17 including an imaging lens 16 is arranged through an adhesive agent 15.

An external connection terminal (electrode), for example, a solder ball 18 is formed on a second major surface, facing the first major surface, of the silicon substrate 10. A light-shielding electromagnetic shield 19 is arranged around the silicon substrate 10 and the glass substrate 12. The light-shielding electromagnetic shield 19 is bonded to the lens holder 17 with an adhesive agent 20. With this structure, a camera module 100 is formed.

The camera module 100 is directly mounted (COB: Chip On Board) on a mounted substrate 200 containing a resin or a ceramic through the solder ball 18.

A sectional structure of a through-electrode formed on the silicon semiconductor substrate 10 in FIG. 1 will be described below in detail.

Figure 2:
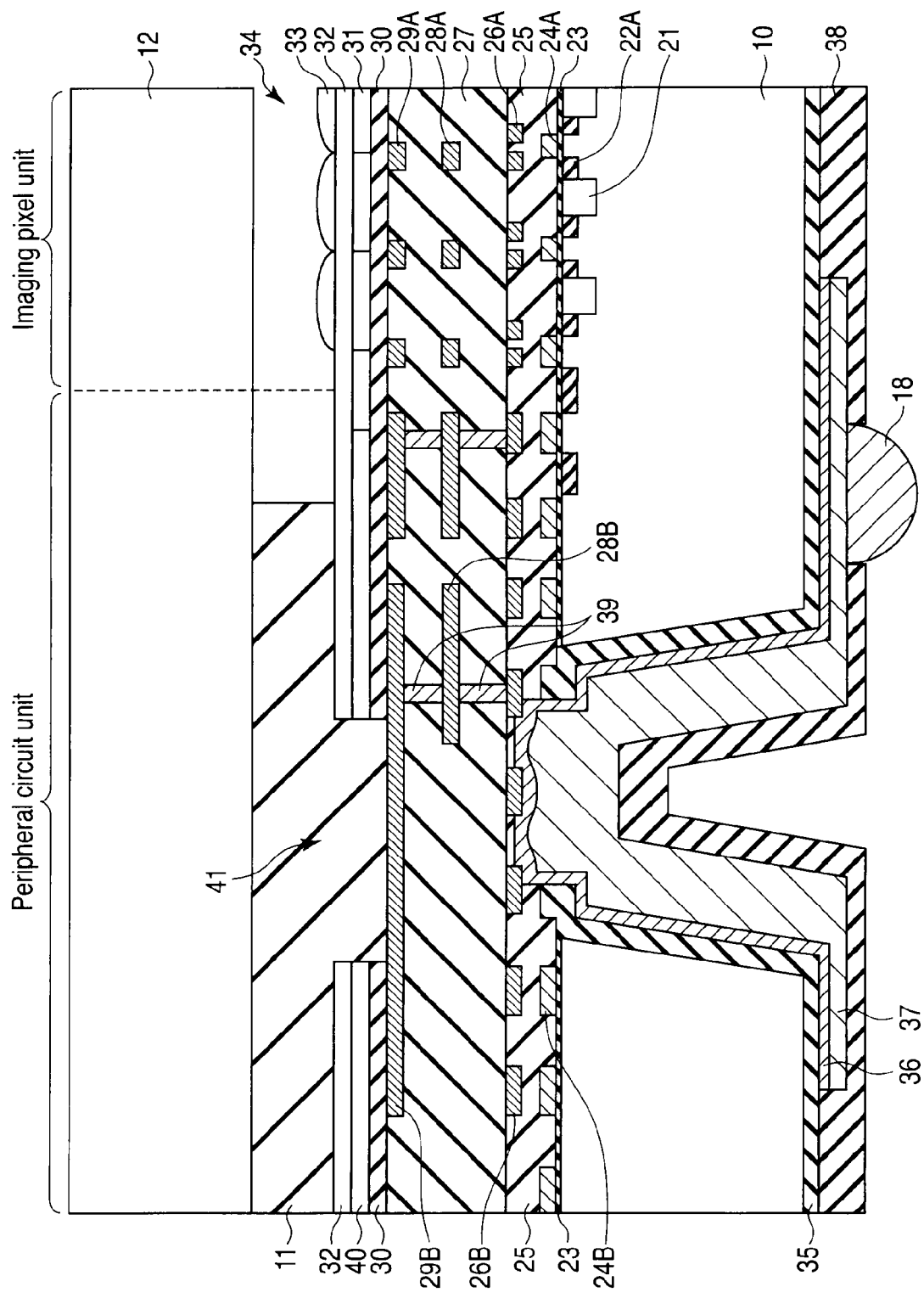
FIG. 2 is an enlarged sectional view showing a through-electrode and a portion near the through-electrode in a camera module according to a first embodiment.

FIG. 2 is an enlarged sectional view showing a through-electrode formed on a silicon semiconductor substrate of the camera module according to the first embodiment and a portion near the through-electrode. The camera module comprises an imaging pixel unit in which an imaging element 21 is formed and a peripheral circuit unit which processes a signal output from the imaging pixel unit.

The imaging pixel unit of the camera module has the following configuration.

On the first major surface of the silicon semiconductor substrate 10, an element isolation insulating film (for example, STI (Shallow Trench Isolation)) 22A and an element region isolated by the element isolation insulating film 22A are arranged. In the element region, the imaging element 21 including a photodiode and a transistor is formed.

A gate insulating film (for example, silicon oxide film) 23 is formed on the first major surface on which the imaging element 21 is formed, and a gate electrode 24A is formed on the gate insulating film 23. The gate electrode 24A is constituted by a conductive film, for example, a polysilicon film.

An interlayer insulating film (for example, silicon oxide film) 25 is formed on the gate electrode 24A and the gate insulating film 23. A first interconnection layer (for example, copper layer) 26A is formed in the interlayer insulating film 25. An interlayer insulating film (for example, silicon oxide film) 27 is formed on the interlayer insulating film 25 and the first interconnection layer 26A. Furthermore, a second interconnection layer 28A and a third interconnection layer 29A are formed in the interlayer insulating film 27.

A base layer 30 is formed on the interlayer insulating film 27 and the third interconnection layer 29A. On the base layer 30, color filters 31 are arranged to correspond to the imaging elements 21, respectively.

An overcoat 32 is formed on the color filter 31, and microlenses 33 are formed on the overcoat 32 to correspond to the imaging elements 21 (or color filters 31), respectively. Furthermore, a cavity 34 is formed above the microlenses 33. An optical transmission support substrate (transparent substrate), for example, the glass substrate 12 is arranged above the cavity 34.

Figure 3:
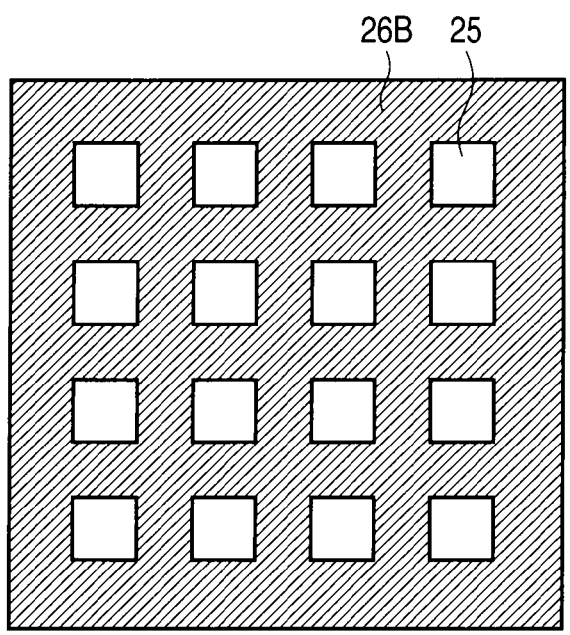
FIG. 3 is a plan view of an electrode pad in the camera module according to the first embodiment.

The following through-electrode and electrode pad are formed in the peripheral circuit unit of the camera module. The interlayer insulating film 25 is formed on the first major surface of the silicon semiconductor substrate 10, and a first electrode pad 26B is formed in the interlayer insulating film 25. The first electrode pad 26B is formed of a conductive material such as a metal, for example, copper (Cu). The copper pattern includes a copper-free free region. More specifically, as shown in FIG. 3, when viewed from a direction perpendicular to the first major surface of the silicon substrate 10, i.e., when viewed from above, a plurality of free regions are arranged at predetermined intervals in the form of a matrix in the first electrode pad 26B, and the interlayer insulating film (silicon oxide film) 25 is arranged in the free region. The first electrode pad 26B is formed of the same material as the first interconnection layer 26A and is formed in the same steps as the first interconnection layer 26A.

A through-hole which penetrates the silicon substrate 10 from the second major surface to the first major surface thereof is formed. Furthermore, the through-hole reaches a surface of the first electrode pad 26B. An insulating film (for example, silicon oxide film) 35 is formed on a side surface of the through-hole and on the second major surface. In addition, a barrier metal 36 and a copper film 37 which constitute the through-electrode are formed on an internal surface of the through-hole and on the second major surface, i.e., on a surface of the first electrode pad 26B on the through-hole side, on a surface of the interlayer insulating film 25 in the free region of the first electrode pad 26B on the through-hole side, and on the insulating film 35.

The gate insulating film (silicon oxide film) 23 is formed on the first major surface of the silicon substrate 10 near the through-electrode. A polysilicon film 24B serving as a dummy film is formed on the gate insulating film 23. The polysilicon film 24B is formed of the same material as the gate electrode 24A and is formed in the same steps as the gate electrode 24A.

The interlayer insulating film (silicon oxide film) 25 is formed on the polysilicon film 24B and the gate insulating film 23. The first electrode pad 26B is formed in the interlayer insulating film 25. The first electrode pad 26B is formed of the same material as the first interconnection layer 26A and is formed in the same steps as the first interconnection layer 26A.

The polysilicon film 24B is arranged at a position corresponding to the first electrode pad 26B in a direction perpendicular to the first major surface of the silicon substrate 10, and is constituted by the same pattern as the first electrode pad 26B or a pattern smaller than the first electrode pad 26B. The polysilicon film 24B is constituted by a film having the same etching characteristics as the silicon substrate 10. In this case, the polysilicon film 24B and the silicon substrate 10 are constituted by films containing silicon. Furthermore, the polysilicon film 24B has, as etching characteristics, a low etching selectivity ratio to the silicon substrate 10 and a high etching selectivity ratio to the interlayer insulating film (silicon oxide film) 25.

A protecting film, for example, a solder resist 38 is formed on the copper film 37 and on the insulating film 35 on the second major surface. Furthermore, a part of the solder resist 38 on the copper film 37 is opened on the second major surface, and an external connection terminal, for example, the solder ball 18 is formed on the exposed copper film 37.

With the above structure, the through-electrode formed in the through-hole and constituted by the barrier metal 36 and the copper film 37 electrically connects the solder ball 18 connected to the outside, the first electrode pad 26B or the peripheral circuit, and the imaging element 21 to one another.

The solder resist 38 is made of, for example, a phenol resin, a polyimide resin, or an amine resin. As the solder ball 18, for example, Sn-Pp (eutectic) or 95Pb—Sn (high-lead high-melting-point solder) is used. As a Pb-free solder, Sn—Ag, Sn—Cu, Sn—Ag—Cu, or the like is used.

A second electrode pad 29B is formed through the interlayer insulating film 27 on the first electrode pad 26B. The second electrode pad 29B is formed of the same material as the third interconnection layer 29A and is formed in the same steps as the third interconnection layer 29A. In the interlayer insulating film 27 between the first electrode pad 26B and the second electrode pad 29B, a contact plug 39 which electrically connects these electrodes to each other and a second interconnection layer 28B are formed. For example, the second electrode pad 29B is used for application of a voltage, reading of a signal, or the like through the contact plug 39 and the second interconnection layer 28B. In particular, in die sort test, a test probe is brought into contact with the second electrode pad 29B.

Furthermore, the base layer 30 is formed on the second electrode pad 29B. A protecting film 40 is formed on the base layer 30, and the overcoat 32 is formed on the protecting film 40. The base layer 27, the protecting film 40, and the overcoat 32 arranged on the second electrode pad 29B are opened to form a pad opening 41.

The glass substrate 12 is formed on the overcoat 32 and the second electrode pad 29B through the adhesive agent 11. The adhesive agent 11 is patterned and is not arranged on the imaging element 21 (or on the microlenses 33).

In the first embodiment, the electrode pad to which the through-electrode is connected has a pattern including a net-like free region or rod-like regions, and an insulating film is buried in the free region. The polysilicon film has the same pattern as the electrode pad including the free region and is formed at the same position as the electrode pad in a direction perpendicular to the silicon substrate plane.

As shown in FIG. 2, on a surface on which the through-electrode is formed, a step generated by the insulating film 25 being present in the free region and the first electrode pad 26B is reduced. For this reason, when a through-electrode is to be formed on the first electrode pad 26B and the surface of the insulating film 25 on the through-hole side, the barrier metal 36 and the copper film 37 can be formed without forming a void or the like. In this manner, the reliability of the through-electrode formed in the silicon substrate can be improved.

A method of manufacturing a through-electrode in the camera module according to the first embodiment will be described below.

FIGS. 4 to 11 are sectional views showing the method of manufacturing a through-electrode in the camera module according to the first embodiment.

Figure 4:
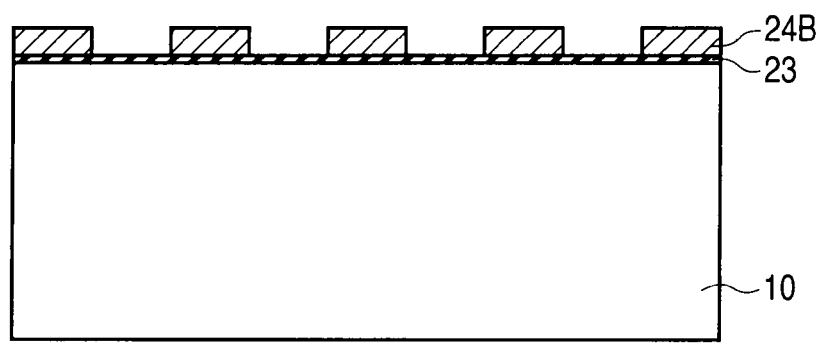

As shown in FIG. 4, the gate insulating film (for example, silicon oxide film) 23 is formed on the silicon semiconductor substrate 10 by a thermal oxidation method. Furthermore, a polysilicon film is formed on the gate insulating film 23 by a low pressure-chemical vapor deposition (CVD) method. The polysilicon film 24B serving as a dummy film is formed by a photolithography method. Thereafter, the interlayer insulating film (for example, silicon oxide film) 25 is formed on the polysilicon films 24B and the gate insulating film 23, and portions between the polysilicon films 24B are buried with the interlayer insulating film 25.

In this case, when copper having a resistivity lower than that of aluminum (Al) is used as the material of the electrode pad 26B, in order to prevent dishing and to secure flatness, as shown in FIG. 3, the electrode pad 26B is formed by a buried interconnection method (damascene method) to have a copper-free region (free region). In the embodiment, the electrode pad including the free region is formed of copper. However, the material used in the electrode pad is not limited to copper, and another material can also be used as the material of the electrode pad.

Figure 5:
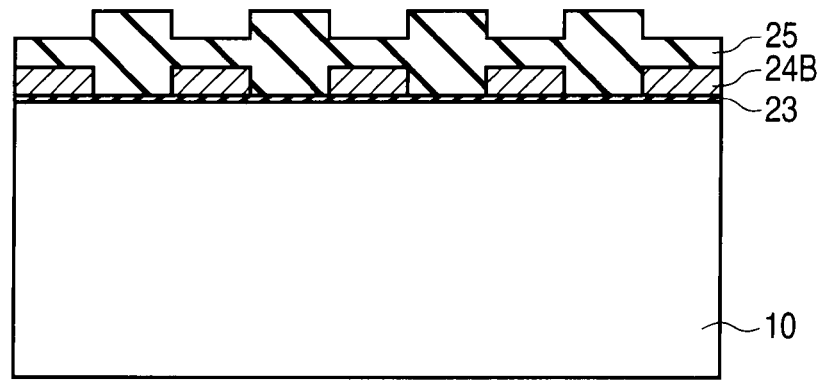
Figure 6:
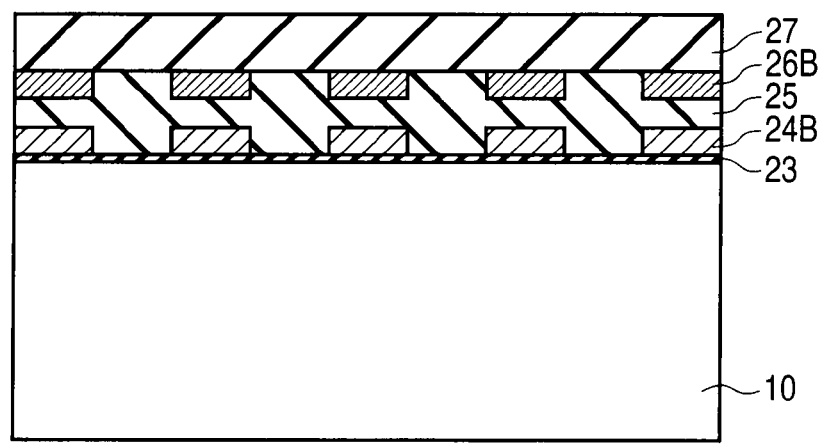

As shown in FIG. 5, the interlayer insulating film 25 is etched to form a trench interconnection pattern to be buried with copper. Subsequently, in order to improve the adhesion of copper, a barrier metal is formed in the trench interconnection pattern in a vacuum state by a sputtering method, and seed copper to form a copper plating film is continuously formed by a sputtering method. Copper is buried on the seed copper by plating, and excessive copper formed on the surface of the interlayer insulating film 25 is removed by CMP. With the above operation, as shown in FIG. 6, the electrode pad 26B is formed in the interlayer insulating film 25. At this time, in a direction perpendicular to the first major surface of the silicon substrate 10, the first electrode pad 26B and the polysilicon film 24B are arranged at positions corresponding to each other. The first electrode pad 26B is constituted by the same pattern as the polysilicon film 24B or a pattern larger than the polysilicon film 24B. As the barrier metal, tantalum (Ta) or titanium (Ti) is used.

Thereafter, as shown in FIG. 6, the interlayer insulating film (for example, silicon oxide film) 27 is formed on the first electrode pad 26B and the interlayer insulating film 25. Simultaneously with the formation of the interlayer insulating film 27, the contact plug 39, the second interconnection layer 28B, and the second electrode pad 29B are formed in the interlayer insulating film 27. Furthermore, the base layer 30, the protecting film 40, and the overcoat 32 are formed on the interlayer insulating film 27 and the second electrode pad 29B. Subsequently, the base layer 30, the protecting film 40, and the overcoat 32 formed on the second electrode pad 29B are opened to form the pad opening 41.

In the subsequent steps, a through-hole is formed in the silicon substrate 10 from the second major surface, and an interconnection and an external connection terminal are formed on the second major surface. These steps will be described below.

An edge of the silicon substrate 10 is processed by edge trimming. An adhesive agent is applied to an upper surface of the silicon substrate 10. Exposure and development are performed to form the adhesive agent 11. The silicon substrate 10 and the glass substrate 12 are bonded to each other by the adhesive agent 11 to reinforce the silicon substrate 10.

A protecting tape (not shown) is stuck on the glass substrate 12. The silicon substrate 10 is polished from the second major surface, and the silicon substrate 10 is further polished by using CMP to thin the silicon substrate 10. Thereafter, the protecting tape is peeled off the glass substrate 12. With the above steps, the silicon substrate 10 is finished to have a thickness of about 100 μm. In this manner, the silicon substrate 10 is thinned to make it easy to form the through-hole.

A resist is applied to the second major surface of the silicon substrate 10, and exposure and development are performed to form a resist pattern to form a through-hole therein. As shown in FIG. 7, the silicon substrate 10 is etched from the second major surface side by an RIE method to form a through-hole 42. At this time, an etching selectivity ratio (etching rate ratio)

of the silicon substrate 10 containing silicon and the polysilicon film 24B to the gate insulating film 23 constituted by an oxide film and the interlayer insulating film 25 is about 100. Etching for the silicon is stopped when the polysilicon film 24B and the gate insulating film 23 are cut off. Thereafter, the resist pattern is removed by ashing and wet etching.

Furthermore, as shown in FIG. 8, the insulating film (for example, silicon oxide film) 35 is formed on the internal surface of the through-hole 42 and on the second major surface by a CVD method. In this manner, a thickness 101, measured from the electrode pad surface, of the silicon oxide film remaining in the free region of the first electrode pad 26B is greater than a thickness 102 of the silicon oxide film remaining under the first electrode pad 26B.

Figure 9:
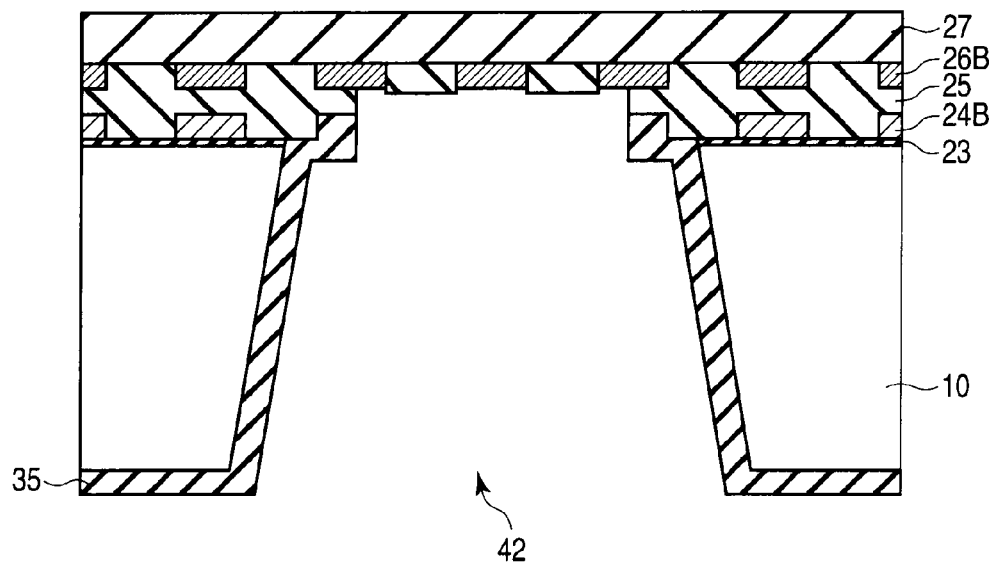

Thereafter, the silicon oxide film on the bottom of the through-hole, i.e., the silicon oxide films 25 and 35 on the through-hole side of the first electrode pad 26B are etched by an RIE method. FIG. 9 shows a state in the middle of etching. At this time, the silicon oxide film 25 remaining in the free region of the electrode pad 26B is larger than the silicon oxide film 25 on a surface of the first electrode pad 26B on the through-hole side.

Figure 10:
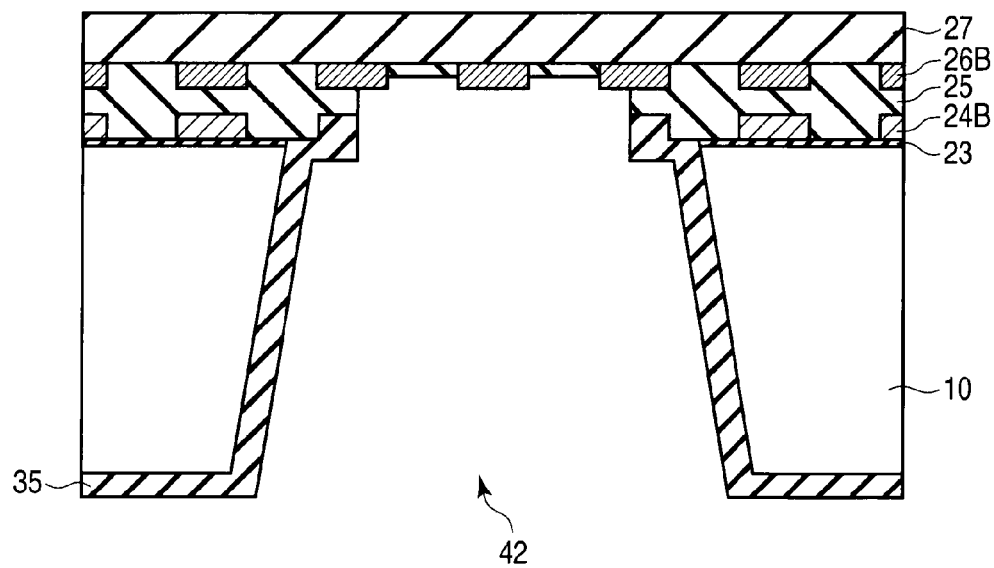

In order to reduce a variation in etching amount of silicon oxide films caused by an in-plane distribution of the silicon substrate 10, the silicon oxide film 25 is overetched. This overetching, as shown in FIG. 10, causes the silicon oxide film 25 being present in the free region of the first electrode pad 26B to retreat to the range of the thickness of the first electrode pad 26B. More specifically, the silicon oxide film 25 is etched to a position between an upper surface (surface on the glass substrate side) and a lower surface (surface on the through-hole side) of the first electrode pad 26B. In this case, an example in which the silicon oxide film in the free region of the first electrode pad 26B is etched to a position between the upper surface and the lower surface of the first electrode pad 26B has been described. However, the silicon oxide film may be located at the same position as the upper surface of the first electrode pad 26B or may be located on the through-hole side with reference to the lower surface of the first electrode pad 26B. In this manner, the size of a step between the interlayer insulating film (silicon oxide film) 25 being present in the free region and the first electrode pad 26B is made less than the thickness of the first electrode pad 26B.

As described above, in the etching for the silicon oxide film on the bottom of the through-hole 42, when the silicon oxide film between the electrode pads 26B is left to be relatively thick, as shown in FIG. 12, the silicon oxide film being present in the free region of the first electrode pad 26B can be prevented from being deeply etched on the glass substrate side. In this manner, as shown in FIG. 10, the step between the silicon oxide film being present in the free region of the first electrode pad 26B and the first electrode pad 26B can be reduced.

Thereafter, as shown in FIG. 11, the barrier metal 36 is formed on the surface of the first electrode pad 26B on the silicon substrate side, the internal surface of the through-hole, and the second major surface by a sputtering method. Subsequently, the resist pattern for copper plating is formed by a photolithography method. Seed copper is formed on the barrier metal 36, and copper plating is performed to form the copper film 37 on the barrier metal 36. In this manner, the flatness of the bottom of the through-hole can be secured.

In this manner, the step between the first electrode pad 26B and the silicon oxide film 25 is reduced to make it easy to form the barrier metal 36 and the seed copper by a sputtering method. For this reason, in the subsequent copper plating step, the copper film 37 can be formed without forming a void.

The solder resist 38 is applied to the second major surface of the silicon substrate 10, exposure and development are performed, and heat treatment is performed to solidify the solder resist 38, so that resin molding is performed. Furthermore, a part of the solder resist 38 on the copper film 37 is opened, and an external connection terminal, for example, the solder ball 18 is formed on the copper film 37.

With the above manufacturing steps, a through-electrode is formed in the silicon substrate 10. The through-electrode electrically connects the first electrode pad 26B to the solder ball 18.

Thereafter, by dicing, the silicon semiconductor substrates (imaging element chips) 10 are separately cut out of the wafer. A focal point is adjusted to the module package to mount the lens holder 17 on the chip 10. Furthermore, the lower surface of the chip 10 and the outside of the module are fixed by the shield 19. An image test of the manufactured camera module is performed to complete a camera module.

In the first embodiment, even in the structure comprising an electrode pad including a free region in which no pattern is formed, a highly reliable through-electrode can be formed without forming a void in the through-electrode connected to the electrode pad. In this manner, a camera module (semiconductor package) realized with the size of an imaging chip itself can be formed, and a camera module having the same level as a more miniaturized wafer can be provided.

By using an electrode pad including a free region, even in a copper interconnection having a low resistivity, a metal buried interconnection to prevent dishing and to secure flatness can be performed. As a result, the embodiment can cope with the steps of manufacturing a more miniaturized semiconductor device. The embodiment is useful when a through-electrode is connected to an electrode pad including a free region and is not limited to an interconnection material. In this manner, a through-electrode having desired electrical characteristics can be formed irrespective of a pad material and a structure of the electrode pad to which the through-electrode is to be connected.

Second Embodiment

A camera module according to a second embodiment will be described below.

Figure 13:
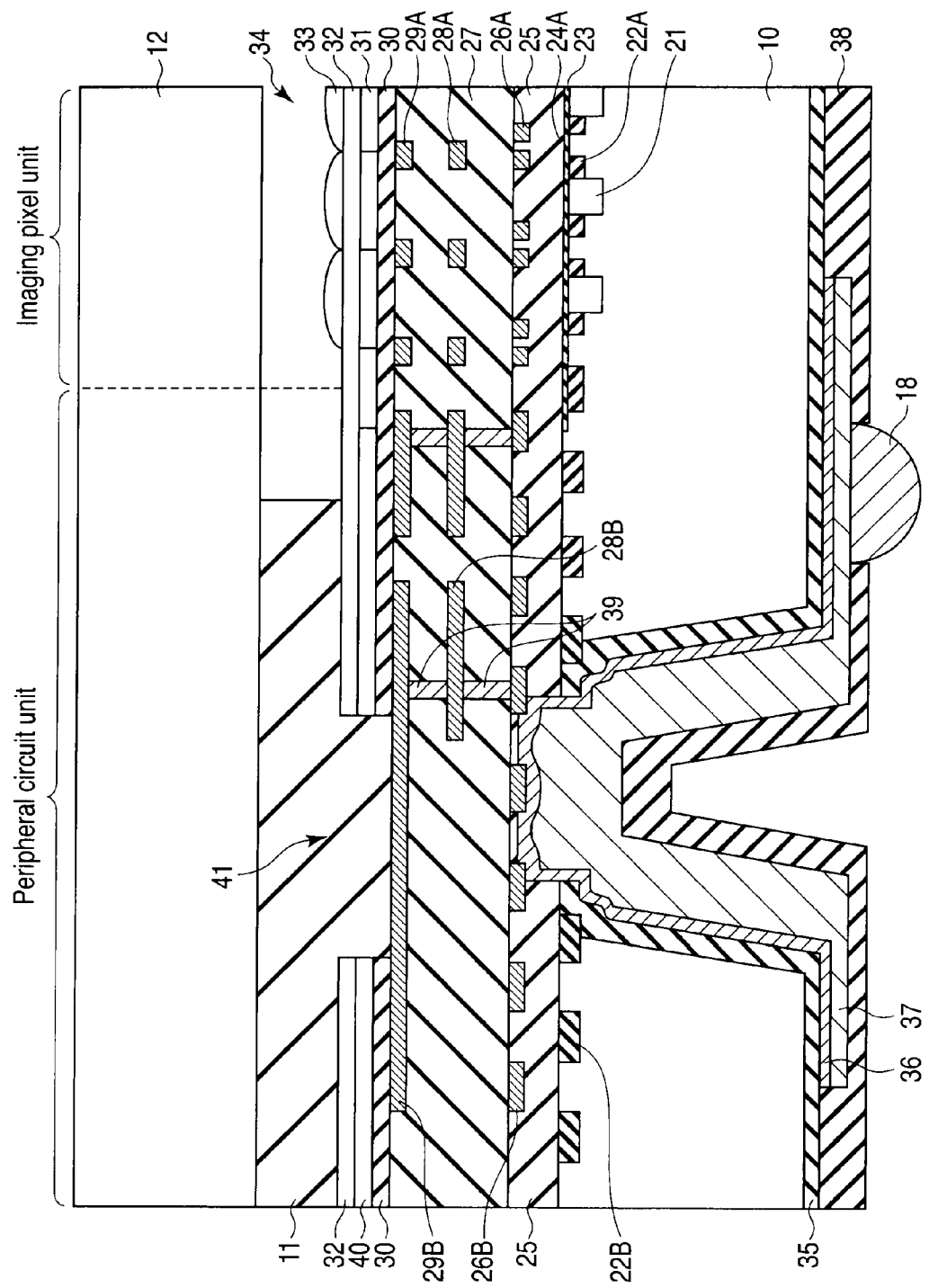
FIG. 13 is an enlarged sectional view showing a through-electrode and a portion near the through-electrode in a camera module according to a second embodiment.

FIG. 13 is an enlarged sectional view showing a through-electrode formed on a silicon semiconductor substrate and a portion near the through-electrode in the camera module according to the second embodiment.

In the second embodiment, an element isolation insulating film (STI) 22B is formed in the silicon semiconductor substrate 10 under the electrode pad 26B on which a through-electrode is formed. The STI 22B is arranged at a position corresponding to a free region of the first electrode pad 26B in a direction perpendicular to the first major surface of the silicon semiconductor substrate 10. The STI 22B is formed to have the same pattern as the free region of the first electrode pad 26B or a pattern larger than the free region.

The STI 22B is formed in the silicon semiconductor substrate 10 under the free region to make the thickness of the interlayer insulating film (silicon oxide film) 25 in the free region greater than the thickness of the interlayer insulating film (silicon oxide film) 25 under the first electrode pad 26B when the silicon semiconductor substrate 10 is etched in etching for the through-hole. In this manner, in the etching for the through-hole, the silicon oxide film in the free region can be prevented from being deeply etched over the first electrode pad 26B, and a step between the first electrode pad 26B and the silicon oxide film in the free region can be reduced.

For this reason, after the through-electrode is formed, as shown in FIG. 13, the STI 22B is arranged in the silicon substrate 10 under the free region of the first electrode pad 26B near the through-electrode. In this embodiment, the polysilicon film 24B is not formed under the first electrode pad 26B. The other configuration is the same as that of the first embodiment.

In the camera module according to the second embodiment having the above structure, as in the first embodiment, a highly reliable through-electrode can be formed without forming a void in the through-electrode connected to the electrode pad.

A method of manufacturing a through-electrode in the camera module according to the second embodiment will be described below. FIGS. 14 to 21 are sectional views showing a method of manufacturing the through-electrode in the camera module according to the second embodiment.

As shown in FIG. 14, the STI (for example, silicon oxide film) 22B is formed in the silicon semiconductor substrate 10. More specifically, a shallow trench is formed in the silicon substrate 10, and a silicon oxide film is deposited on the silicon semiconductor substrate 10. An excessive silicon oxide film on the silicon semiconductor substrate 10 is polished by CMP to form the STI 22B in the shallow trench.

Thereafter, the interlayer insulating film (for example, silicon oxide film) 25 is formed on the STI 22B and the silicon semiconductor substrate 10.

As in the first embodiment, the first electrode pad 26B having a free region is formed by a buried interconnection method. Also in the second embodiment, the electrode pad including the free region is formed of copper. However, the material used in the electrode pad is not limited to copper, and another material can also be used in the electrode pad.

As shown in FIG. 15, the interlayer insulating film 25 is etched to form a trench interconnection pattern in which copper is to be buried. Subsequently, in order to improve the adhesion of copper, a barrier metal is formed in the trench interconnection pattern in a vacuum state by a sputtering method, and seed copper to form a copper plating film is continuously formed by a sputtering method. Copper is buried on the seed copper by plating, and excessive copper formed on the surface of the interlayer insulating film 25 is removed by CMP. With the above operation, as shown in FIG. 16, the first electrode pad 26B is formed in the interlayer insulating film 25. At this time, in a direction perpendicular to the first major surface of the silicon substrate 10, the free region of the first electrode pad 26B and the STI 22B are arranged at positions corresponding to each other. The free region of the first electrode pad 26B is constituted by the same pattern as the STI 22B or a pattern smaller than the STI 22B.

Thereafter, the step of forming the interlayer insulating film (for example, silicon oxide film) 27 on the first electrode pad 26B and the interlayer insulating film 25 to the step of forming the pad opening 41 are the same as those in the first embodiment.

In the subsequent steps, a through-hole is formed in the silicon semiconductor substrate 10 from the second major surface side, and an interconnection and an external connection terminal are formed on the second major surface. These steps will be described below.

The step of thinning the silicon substrate 10 to make it easy to form a through-hole is the same as that in the first embodiment.

Figure 17:
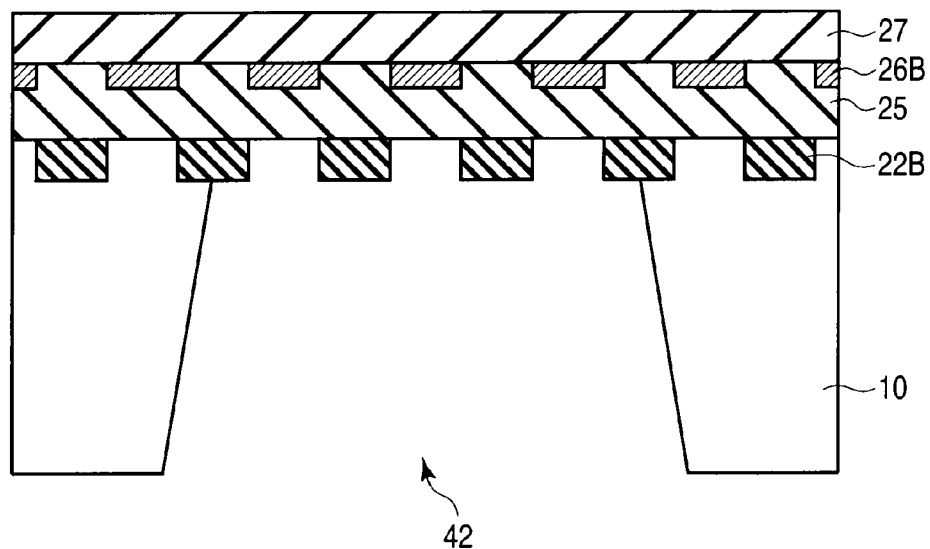

A resist is applied to the second major surface of the silicon substrate 10, and exposure and development are performed to form a resist pattern to form a through-hole therein. As shown in FIG. 17, the silicon substrate 10 is etched from the second major surface by an RIE method to form the through-hole 42.

At this time, an etching selectivity ratio (etching rate ratio) of the silicon substrate 10 containing silicon to the STI 22B and the interlayer insulating film 25 constituted by an oxide film is about 100. Etching for the silicon is stopped when the silicon substrate 10 is cut off. Thereafter, the resist pattern is removed by ashing and wet etching.

Figure 18:
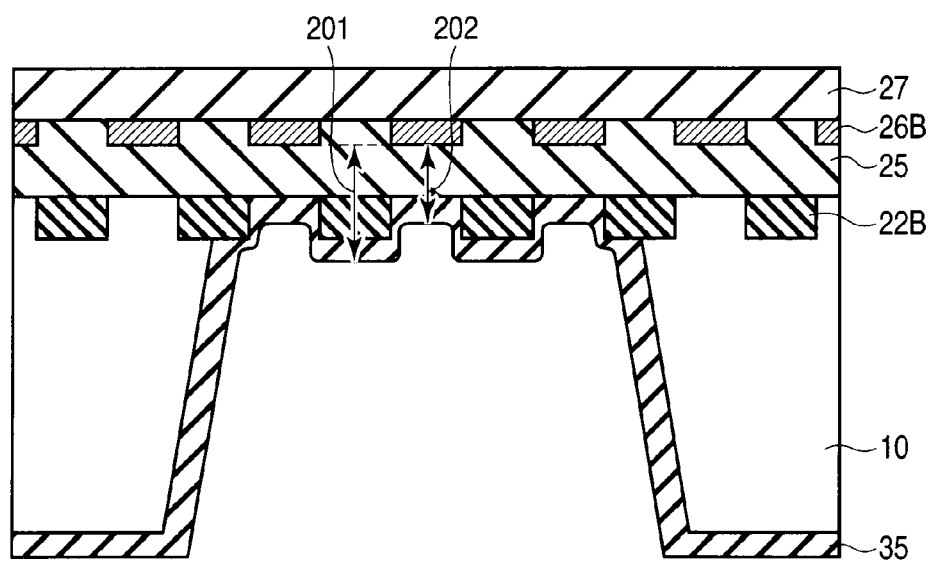

Furthermore, as shown in FIG. 18, the insulating film (for example, silicon oxide film) 35 is formed on the internal surface of the through-hole 42 and on the second major surface by a CVD method. In this manner, a thickness 201, measured from the electrode pad surface, of the silicon oxide film remaining in the free region of the first electrode pad 26B is greater than a thickness 202 of the silicon oxide film remaining under the first electrode pad 26B.

Thereafter, the silicon oxide film on the bottom of the through-hole, i.e., the silicon oxide films 25 and 35 on the through-hole side of the first electrode pad 26B are etched by an RIE method. FIG. 19 shows a state in the middle of etching. At this time, the silicon oxide film 25 remaining in the free region of the first electrode pad 26B is larger than the silicon oxide film 25 on a surface of the first electrode pad 26B on the through-hole side.

In order to reduce a variation in etching amount of silicon oxide films caused by an in-plane distribution of the silicon substrate 10, the silicon oxide film 25 is overetched. This overetching, as shown in FIG. 20, causes the silicon oxide film 25 being present in the free region of the first electrode pad 26B to retreat to the range of the thickness of the first electrode pad 26B. More specifically, the silicon oxide film 25 is etched to a position between an upper surface (surface on the glass substrate side) and a lower surface (surface on the through-hole side) of the first electrode pad 26B. In this case, the silicon oxide film in the free region of the first electrode gad 26B is etched to a position between the upper surface and the lower surface of the first electrode pad 26B. However, the silicon oxide film may be located at the same position as the upper surface of the first electrode pad 26B or may be located on the through-hole side with reference to the lower surface of the first electrode pad 26B. In this manner, the size of a step between the interlayer insulating film (silicon oxide film) 25 being present in the free region and the first electrode pad 26B is made less than or equal to the thickness of the first electrode pad 26B.

As described above, in the etching for the silicon oxide film on the bottom of the through-hole 42, when the silicon oxide film in the free region of the first electrode pad 26B is left to be relatively thick, the silicon oxide film being present in the free region between of the first electrode pad 26B can be prevented from being deeply etched on the glass substrate side. In this manner, as shown in FIG. 20, the step between the silicon oxide film being present in the free region and the first electrode pad 26B can be reduced.

Figure 21:
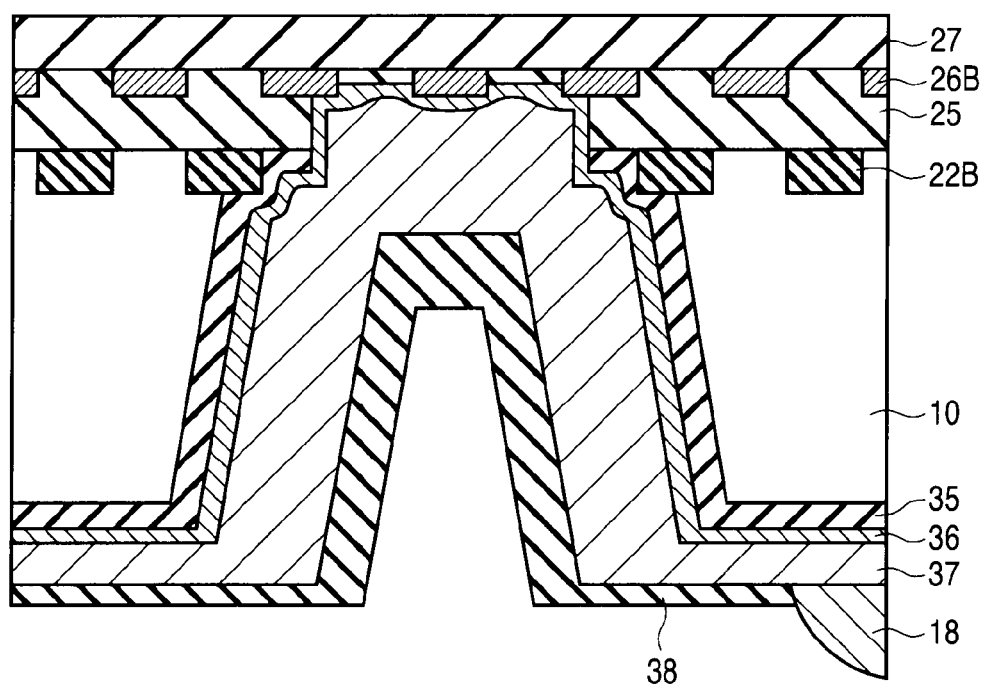

Thereafter, as shown in FIG. 21, the barrier metal 36 is formed on the surface of the first electrode pad 26B on the silicon substrate side, the internal surface of the through-hole, and the second major surface. Furthermore, the copper film 37 is formed on the barrier metal 36. In this manner, the flatness of the bottom of the through-hole can be secured.

In this manner, the step between the first electrode pad 26B and the silicon oxide film 25 is reduced to make it easy to form the barrier metal 36 and the seed copper by a sputtering method. As a result, in the subsequent copper plating step, the copper film 37 can be formed without forming a void.

Thereafter, the steps from the step of forming the solder resist 38 to the step of completing the camera module shown in FIG. 13 are the same as those in the first embodiment.

In the second embodiment, even in the structure comprising an electrode pad including a free region in which no pattern is formed, a highly reliable through-electrode can be formed without forming a void in the through-electrode connected to the electrode pad.

As described above, according to the second embodiment, when the STI 22B is formed in the silicon substrate 10 immediately under the free region of the first electrode pad 26B, in etching for the through-hole, a step between the silicon oxide film being present in the free region and the first electrode pad 26B can be reduced. In this manner, a highly reliable through-electrode can be formed. The other effects are the same as those in the first embodiment.

Third Embodiment

A camera module according to a third embodiment will be described below.

Figure 22:
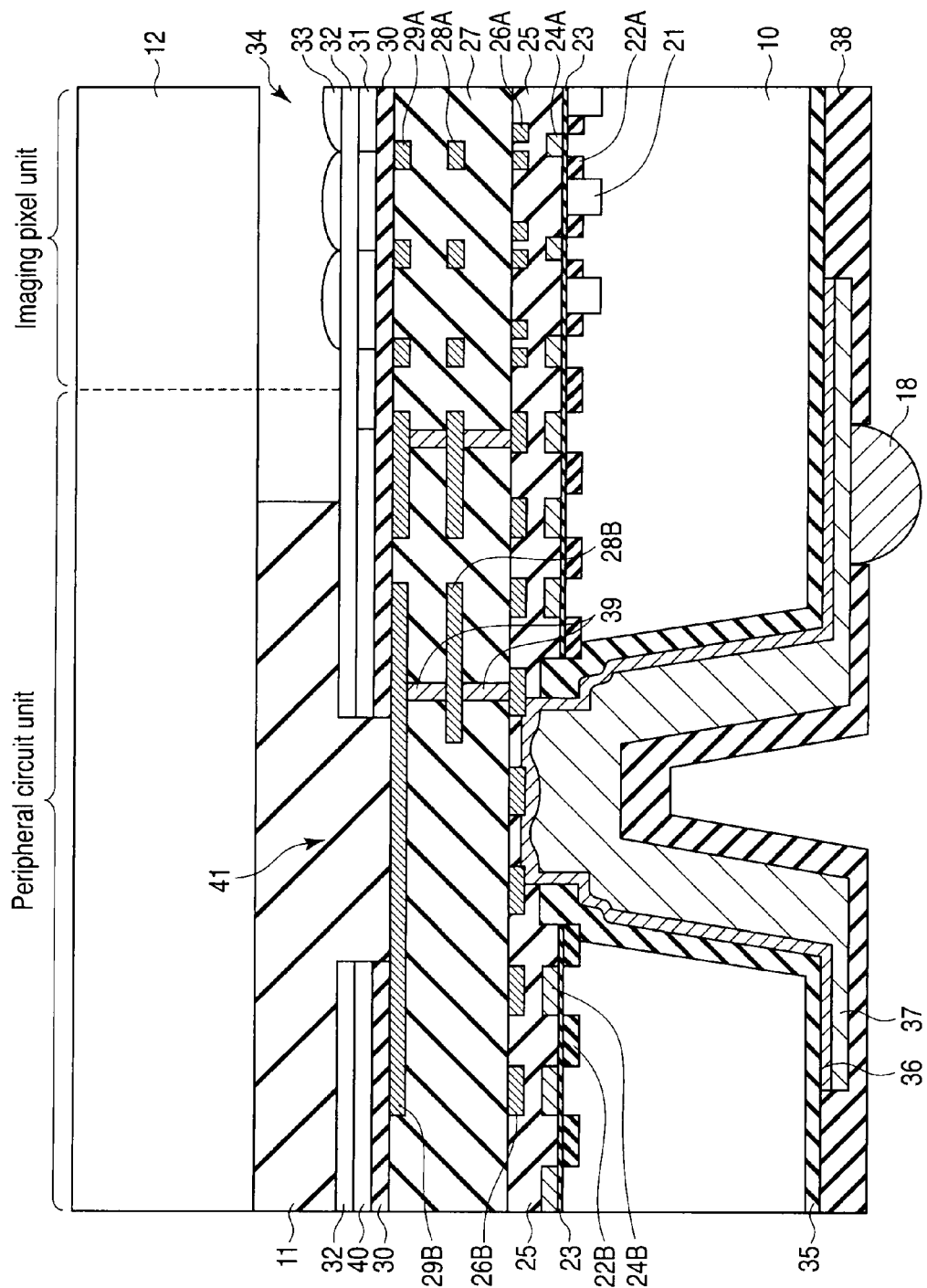
FIG. 22 is an enlarged sectional view showing a through-electrode and a portion near the through-electrode in a camera module according to a third embodiment.

FIG. 22 is an enlarged sectional view showing a through-electrode formed on a silicon semiconductor substrate of the camera module according to the third embodiment and a portion near the through-electrode.

In the third embodiment, a conductive film serving as a dummy film, for example, the polysilicon film 24B is formed on the silicon substrate 10 under the first electrode pad 26B, and the STI 22B is formed in the silicon substrate 10 under the free region of the first electrode pad 26B.

The polysilicon film 24B is arranged at a position corresponding to the first electrode pad 26B in a direction perpendicular to the first major surface of the silicon substrate 10. The polysilicon film 24B is constituted by the same pattern as the first electrode pad 26B or a pattern smaller than the first electrode pad 26B.

The STI 22B is arranged at a position corresponding to a free region of the first electrode pad 26B in a direction perpendicular to the first major surface of the silicon substrate 10. The STI 22B is constituted by the same pattern as the free region of the first electrode pad 26B or a pattern larger than the free region.

The polysilicon film 24B is formed on the silicon substrate 10 under the first electrode pad 26B, and the STI 22B is formed in the silicon substrate 10 under the free region, so that the thicknesses of the interlayer insulating film (silicon oxide film) 25 and the STI (silicon oxide film) 22B in the free region are greater than that of the interlayer insulating film (silicon oxide film) 25 under the first electrode pad 26B when the silicon substrate 10 and the polysilicon film 24B are etched in etching for the through-hole. In this manner, in the etching for the through-hole, the silicon oxide film in the free region can be prevented from being deeply etched over the first electrode pad 26B, and a step between the first electrode pad 26B and the silicon oxide film in the free region can be reduced.

For this reason, after the through-electrode is formed, as shown in FIG. 22, the polysilicon film 24B is arranged on the silicon substrate 10 under the first electrode pad 26B near the through-hole, and the STI 22B is arranged in the silicon substrate 10 under the free region of the first electrode pad 26B. The other configuration is the same as that in the first embodiment.

In the camera module according to the third embodiment having the above structure, as in the first and second embodiments, a highly reliable through-electrode can be formed without forming a void in the through-electrode connected to the electrode pad. Furthermore, in the third embodiment, since both the polysilicon film 24B and the STI 22B are formed, a step between the first electrode pad 26B and the silicon oxide film in the free region can be reduced to be smaller than those in the first and second embodiments, and a highly reliable through-electrode can be formed. The other effects are the same as those in the first embodiment.

A method of manufacturing a through-electrode in the camera module according to the third embodiment will be described below. FIGS. 23 to 29 are sectional views showing a method of manufacturing the through-electrode in the camera module according to the third embodiment.

As shown in FIG. 23, the STI (for example, silicon oxide film) 22B is formed in the silicon semiconductor substrate 10. The gate insulating film 23 is formed on the silicon substrate 10 by, for example, a thermal oxidation method. Furthermore, the polysilicon film 24B is formed on the gate insulating film 23 as a dummy film by a photolithography method.

Thereafter, the interlayer insulating film (for example, silicon oxide film) 25 is formed on the polysilicon film 24B and the gate insulating film 23.

As in the first embodiment, the first electrode pad 26B having a free region is formed by a buried interconnection method. As shown in FIG. 24, the first electrode pad 26B is formed in the interlayer insulating film 25. Also in the third embodiment, the electrode pad including the free region is formed of copper. However, the material used in the electrode pad is not limited to copper, and another material can also be used in the electrode pad.

In this case, in a direction perpendicular to the first major surface of the silicon substrate 10, the first electrode pad 26B and the polysilicon film 24B are arranged at positions corresponding to each other. The first electrode pad 26B is constituted by the same pattern as the polysilicon film 24B or a pattern larger than the polysilicon film 24B. Furthermore, in a direction perpendicular to the first major surface of the silicon substrate 10, the free region of the first electrode pad 26B and the STI 22B are arranged at positions corresponding to each other. The free region of the first electrode pad 26B is constituted by the same pattern as the STI 22B or a pattern smaller than the STI 22B.

Thereafter, the steps from the step of forming the interlayer insulating film (for example, silicon oxide film) 27 on the first electrode pad 26B and the interlayer insulating film 25 to the step of forming the pad opening 41 are the same as those in the first embodiment.

In the subsequent steps, a through-hole is formed in the silicon substrate 10 from the second major surface, and an interconnection and an external connection terminal are formed on the second major surface. These steps will be described below.

The step of thinning the silicon substrate 10 to make it easy to form the through-hole is the same as that in the first embodiment.

A resist is applied to the second major surface of the silicon semiconductor substrate 10, and exposure and development are performed to form a resist pattern to form a through-hole therein. As shown in FIG. 25, the silicon substrate 10 is etched from the second major surface by an RIE method to form the through-hole 42.

At this time, an etching selectivity ratio (etching rate ratio) of the silicon substrate 10 containing silicon and the polysilicon film 24B to the STI 22B and the interlayer insulating film 25 constituted by an oxide film is about 100. Etching for the silicon is stopped when the silicon substrate 10 and the polysilicon film 24B are cut off. Thereafter, the resist pattern is removed by ashing and wet etching.

Furthermore, as shown in FIG. 26, the insulating film (for example, silicon oxide film) 35 is formed on the internal surface of the through-hole 42 and on the second major surface by a CVD method. In this manner, a thickness 301, measured from the electrode pad surface, of the silicon oxide film remaining in the free region of the first electrode pad 26B is greater than a thickness 302 of the silicon oxide film remaining under the first electrode pad 26B.

Thereafter, the silicon oxide film on the bottom of the through-hole, i.e., the silicon oxide films 25 and 35 on the through-hole side of the first electrode pad 26B are etched by an RIE method. FIG. 27 shows a state in the middle of etching. At this point, the silicon oxide film 25 remaining in the free region of the first electrode pad 26B is larger than the silicon oxide film 25 on a surface of the first electrode pad 26B on the through-hole side.

In this case, in order to reduce a variation in etching amount of silicon oxide films caused by an in-plane distribution of the silicon substrate 10, the silicon oxide film 25 is overetched. This overetching, as shown in FIG. 28, causes the silicon oxide film 25 being present in the free region of the first electrode pad 26B to retreat to the range of the thickness of the first electrode pad 26B. More specifically, the silicon oxide film 25 is etched to a position between an upper surface (surface on the glass substrate side) and a lower surface (surface on the through-hole side) of the first electrode pad 26B. In this case, the silicon oxide film in the free region of the first electrode pad 26B is etched to a position between the upper surface and the lower surface of the first electrode pad 26B. However, the silicon oxide film may be located at the same position as the upper surface of the first electrode pad 26B or may be located on the through-hole side with reference to the lower surface of the first electrode pad 26B. In this manner, the size of a step between the interlayer insulating film (silicon oxide film) 25 being present in the free region and the first electrode pad 26B is made less than or equal to the thickness of the first electrode pad 26B.

As described above, in the etching for the silicon oxide film on the bottom of the through-hole 42, when the silicon oxide film in the free region of the first electrode pad 26B is left to be relatively thick, the silicon oxide film being present in the free region between of the first electrode pad 26B can be prevented from being deeply etched on the glass substrate side. In this manner, as shown in FIG. 28, the step between the silicon oxide film being present in the free region of the first electrode pad 26B and the first electrode pad 26B can be reduced.

Figure 29:
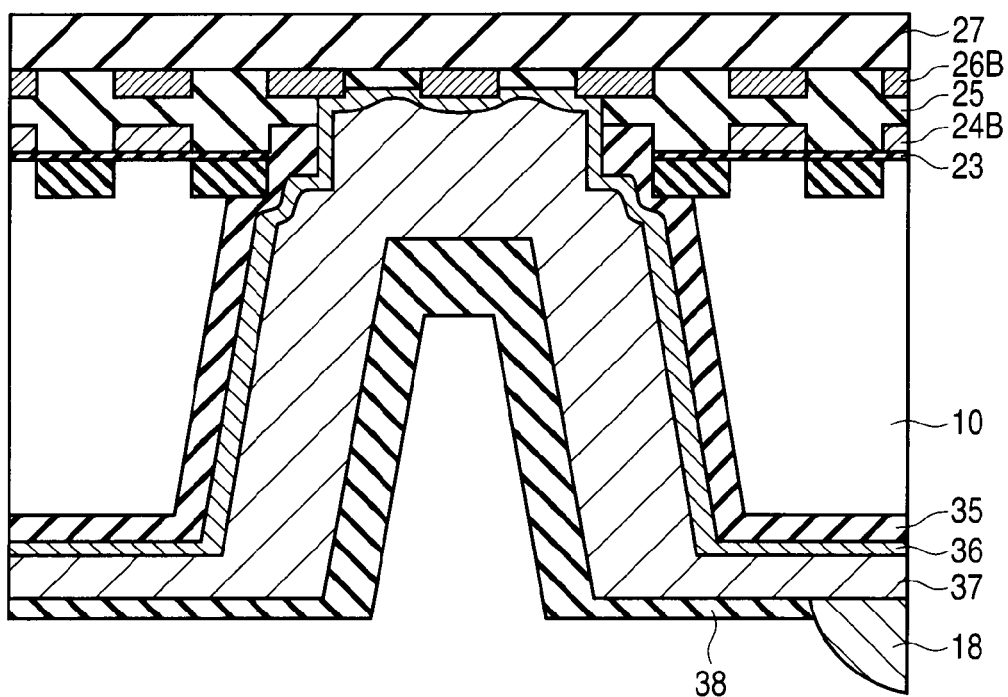

Thereafter, as shown in FIG. 29, the barrier metal 36 is formed on the surface of the first electrode pad 26B on the silicon substrate side, the internal surface of the through-hole, and the second major surface. Furthermore, the copper film 37 is formed on the barrier metal 36. In this manner, the flatness of the bottom of the through-hole can be secured.

In this manner, the step between the first electrode pad 26B and the silicon oxide film 25 is reduced to make it easy to form the barrier metal 36 and the seed copper by a sputtering method. As a result, in the subsequent copper plating step, the copper film 37 can be formed without forming a void.

Thereafter, the steps from the step of forming the solder resist 38 to the step of completing the camera module shown in FIG. 22 are the same as those in the first embodiment.

In the third embodiment, even in the structure comprising an electrode pad including a free region in which no pattern is formed, a highly reliable through-electrode can be formed without forming a void in the through-electrode connected to the electrode pad. Furthermore, in the third embodiment, the thickness of the silicon oxide film can be optimized to minimize the step between the silicon oxide film being present in the free region and the first electrode pad 26B. In this manner, in the third embodiment, a step between the silicon oxide film being present in the free region and the first electrode pad 26B can be reduced to be smaller than those in the first and second embodiments.

As described above, according to the third embodiment, the polysilicon film 24B is formed in the insulating film immediately under the first electrode pad 26B, and the STI 22B is formed in the silicon substrate 10 immediately under the free region, so that, in etching for a through-hole, the thickness of the silicon oxide film is optimized to minimize the step between the silicon oxide film being present in the free region and the first electrode pad 26B. In this manner, a highly reliable through-electrode can be formed. The other effects are the same as those in the first embodiment.

In each of the embodiments, as described above, the polysilicon film 24B is constituted by the same pattern as the first electrode pad 26B. However, the embodiments are not limited to the configuration, and the polysilicon film 24B may be constituted by a pattern smaller than that of the first electrode pad 26B. An example in which the STI 22B is constituted by the same pattern as the free region of the first electrode pad 26B has been described. The embodiments are not limited to the configuration, and the STI 22B may be constituted by a pattern larger than the free region of the first electrode pad 26B.

According to the embodiments, a camera module which can improve reliability of a through-electrode in a semiconductor device comprising a through-electrode, a semiconductor device therefor, and a method of manufacturing the camera module can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first insulating film formed on a first major surface of a semiconductor substrate;
    an electrode pad formed in the first insulating film on the first major surface, the electrode pad including a conductive film, and at least a part of the electrode pad including a free region in which the conductive film is not present when viewed from a direction perpendicular to the first major surface of the semiconductor substrate;
    an external connection terminal formed on a second major surface facing the first major surface of the semiconductor substrate;
    a through-electrode formed in a through-hole formed from the second major surface side of the semiconductor substrate and reaching the electrode pad, the through-electrode electrically connecting the electrode pad and the external connection terminal to each other,
    and a dummy film formed in the first insulating film between the semiconductor substrate and the electrode pad, the dummy film being arranged at a position corresponding to the electrode pad in a direction perpendicular to the first major surface of the semiconductor substrate,
wherein the first insulating film is present in the free region included in the electrode pad, and the first insulating film in the free region in contact with the through-electrode has a thickness less than a thickness of the electrode pad.

2. The semiconductor device according to claim 1,
wherein the dummy film has substantially the same pattern as the electrode pad when viewed from a direction perpendicular to the first major surface of the semiconductor substrate.

3. The semiconductor device according to claim 1,
wherein the dummy film has a pattern smaller than the electrode pad when viewed from a direction perpendicular to the first major surface of the semiconductor substrate.

4. The semiconductor device according to claim 1,
wherein the dummy film has a low etching selectivity ratio to the semiconductor substrate and has a high etching selectivity ratio to the first insulating film.

5. The semiconductor device according to claim 1, further comprising:
an imaging element formed on the first major surface of the semiconductor substrate;
a color filter arranged on the imaging element to correspond to the imaging element; and
a microlens arranged on the color filter.

6. A camera module comprising:
a first insulating film formed on a first major surface of a semiconductor substrate;
an electrode pad formed in the first insulating film on the first major surface, the electrode pad including a conductive film, and at least a part of the electrode pad including a free region in which the conductive film is not present when viewed from a direction perpendicular to the first surface of the semiconductor substrate;
an external connection terminal formed on a second major surface facing the first major surface of the semiconductor substrate;
a through-electrode formed in a through-hole formed from the second major surface side of the semiconductor substrate and reaching the electrode pad, the through-electrode electrically connecting the electrode pad and the external connection terminal to each other;
a dummy film formed in the first insulating film between the semiconductor substrate and the electrode pad, the dummy film being arranged at a position corresponding to the electrode pad in a direction perpendicular to the first major surface of the semiconductor substrate,
an imaging element formed on the first major surface of the semiconductor substrate;
a color filter arranged on the imaging element to correspond to the imaging element;
a microlens arranged on the color filter; and
an imaging lens arranged on the microlens,
wherein the first insulating film is present in the free region included in the electrode pad, and the first insulating film in the free region in contact with the through-electrode has a thickness less than a thickness of the electrode pad.

7. The camera module according to claim 6,
wherein the dummy film has substantially the same pattern as the electrode pad when viewed from a direction perpendicular to the first major surface of the semiconductor substrate.

* * * * *